United States Patent
Sha et al.

(10) Patent No.: US 6,980,581 B1
(45) Date of Patent: Dec. 27, 2005

(54) ADAPTIVE SPREAD SPECTRUM

(75) Inventors: I-Teh Sha, Santa Clara, CA (US); Kuang-Yu Chen, Saratoga, CA (US); Albert Chen, Saratoga, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 766 days.

(21) Appl. No.: 09/618,622

(22) Filed: Jul. 18, 2000

(51) Int. Cl.$^7$ .......................... H04B 15/00; H04K 1/00; H04L 27/30
(52) U.S. Cl. .......................... 375/130; 375/367; 331/10
(58) Field of Search ......................... 331/57, 10, 1 A, 331/2, 8, 17, 25, 23; 375/130, 147, 367, 362, 375/371

(56) References Cited

U.S. PATENT DOCUMENTS

| | | | |
|---|---|---|---|
| 3,689,754 A * | 9/1972 | Le Febre ........................ 708/9 |
| 4,578,649 A   | 3/1986 | Shupe ........................... 331/78 |
| 4,609,884 A * | 9/1986 | Kindinger et al. ............ 331/109 |
| 5,126,692 A * | 6/1992 | Shearer et al. ................ 331/8 |
| 5,148,447 A   | 9/1992 | Ito .............................. 375/7 |
| 5,204,877 A   | 4/1993 | Endo et al. ................... 375/1 |
| 5,226,058 A   | 7/1993 | Anderson et al. ............. 375/1 |
| 5,416,434 A   | 5/1995 | Kootstra et al. ............ 327/113 |
| 5,488,627 A   | 1/1996 | Hardin et al. ............... 375/204 |
| 5,491,458 A   | 2/1996 | McCune, Jr. et al. ....... 332/144 |
| 5,600,280 A * | 2/1997 | Zhang ......................... 331/57 |
| 5,625,325 A * | 4/1997 | Rotzoll et al. ............... 331/16 |
| 5,631,920 A   | 5/1997 | Hardin ........................ 375/200 |
| 5,943,382 A * | 8/1999 | Li et al. ..................... 375/376 |
| 6,167,103 A * | 12/2000 | Hardin ....................... 375/376 |
| 6,240,123 B1 * | 5/2001 | Zhang et al. ............... 375/130 |

FOREIGN PATENT DOCUMENTS

| EP | 0655829 | 5/1995 |
| EP | 0739089 | 10/1996 |

OTHER PUBLICATIONS

I-Teh Sha et al., "Automatic Gain Control VCO (Voltage Control Oscillator)", U.S. Appl. No. 09/618,706, filed Jul. 18, 2000.

* cited by examiner

Primary Examiner—Jean B. Corrielus
(74) Attorney, Agent, or Firm—Christopher P. Maiorana, PC

(57) ABSTRACT

An apparatus comprising a circuit configured to generate a spread spectrum clock signal. The circuit may comprise a voltage controlled oscillator with a gain that may be automatically controlled.

21 Claims, 8 Drawing Sheets

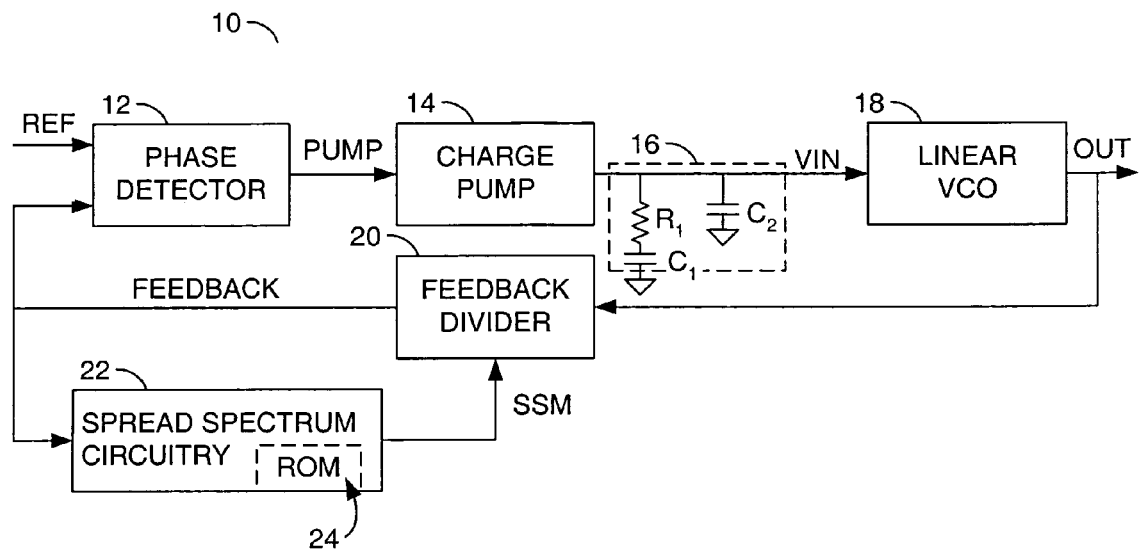
(CONVENTIONAL)
FIG. 1
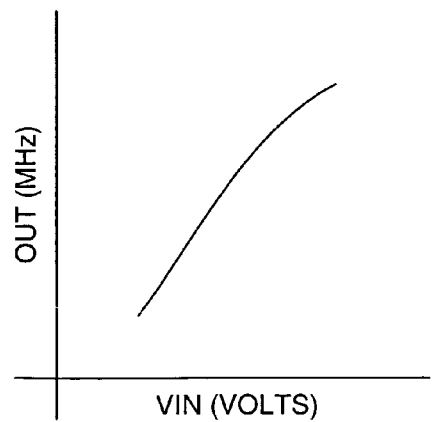
(CONVENTIONAL)
FIG. 2

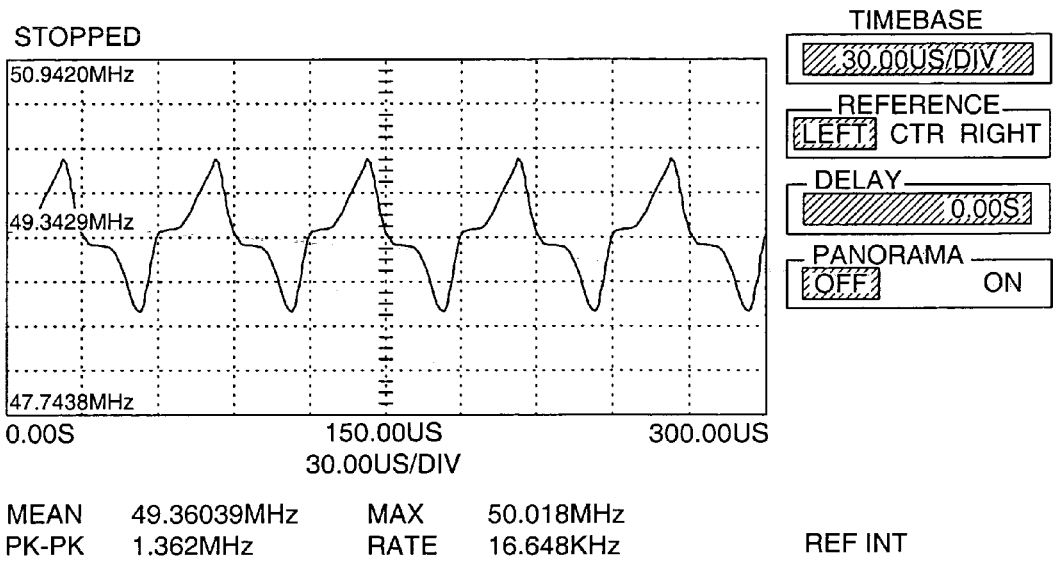
(CONVENTIONAL)
FIG. 3a
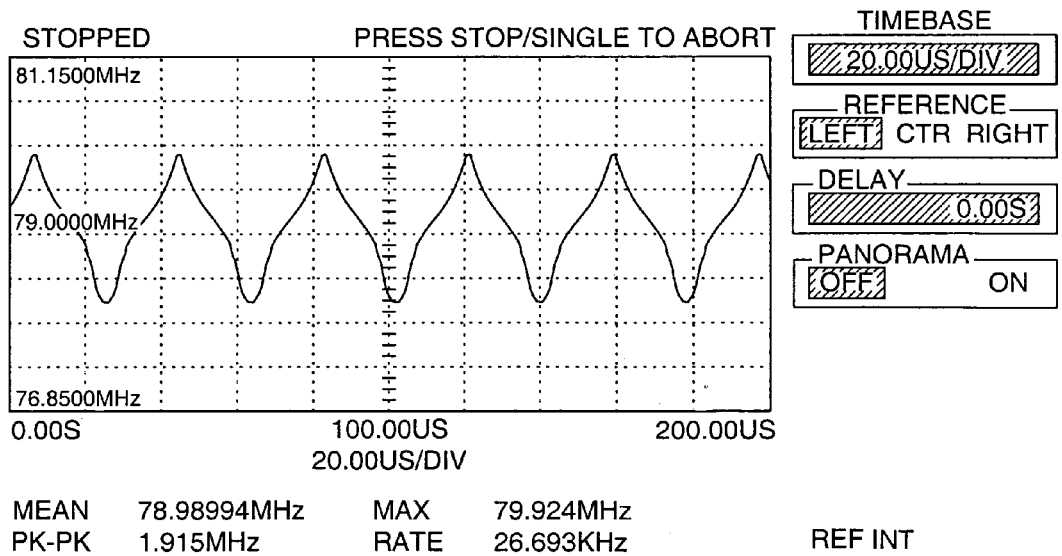
(CONVENTIONAL)
FIG. 3b

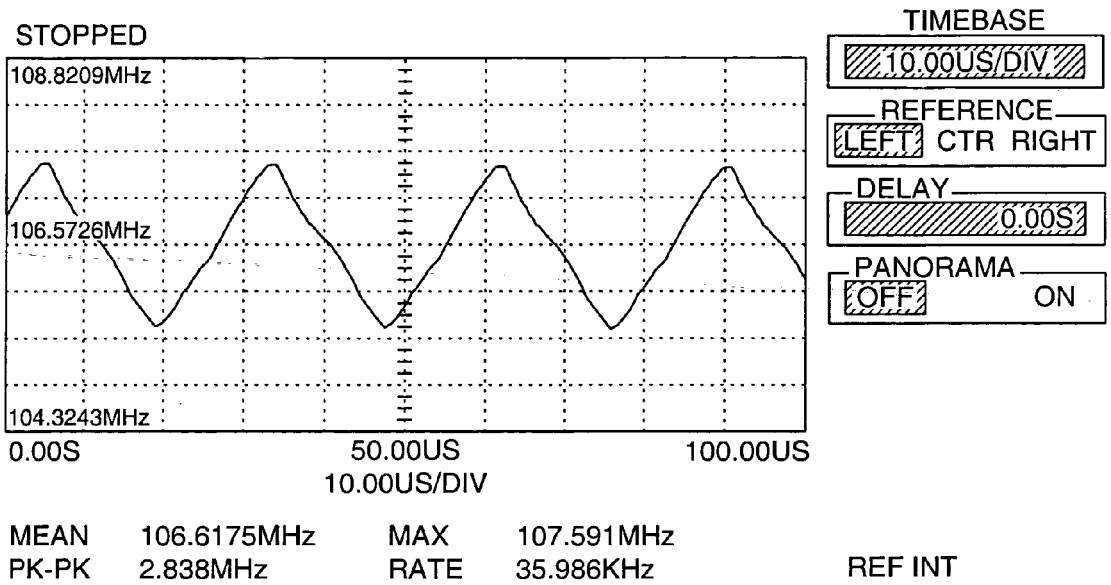
(CONVENTIONAL)
FIG. 3c
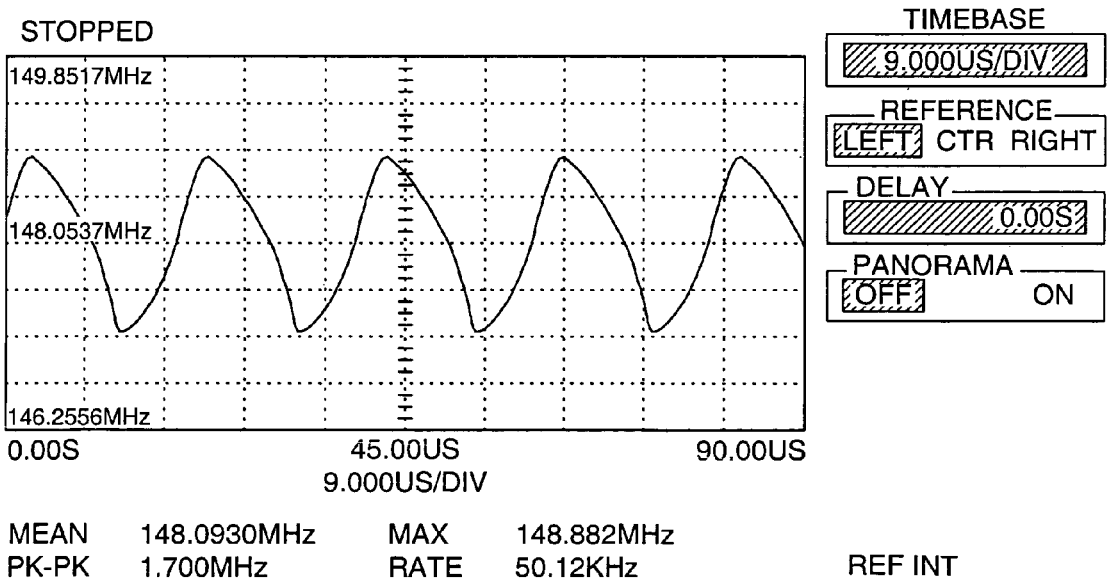
(CONVENTIONAL)
FIG. 3d

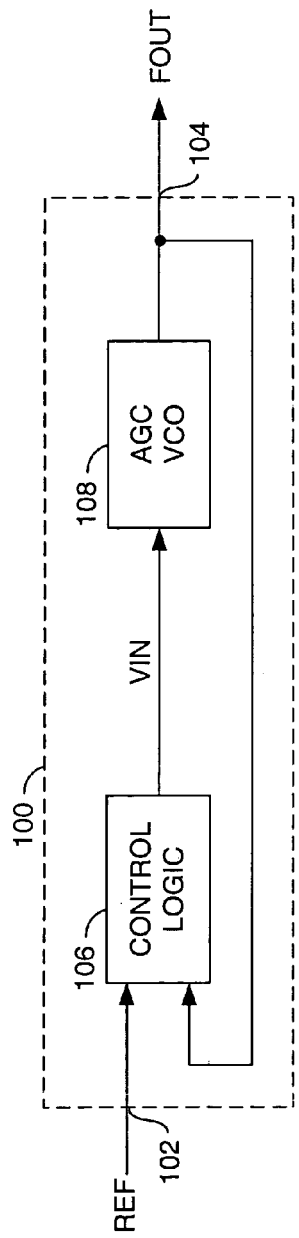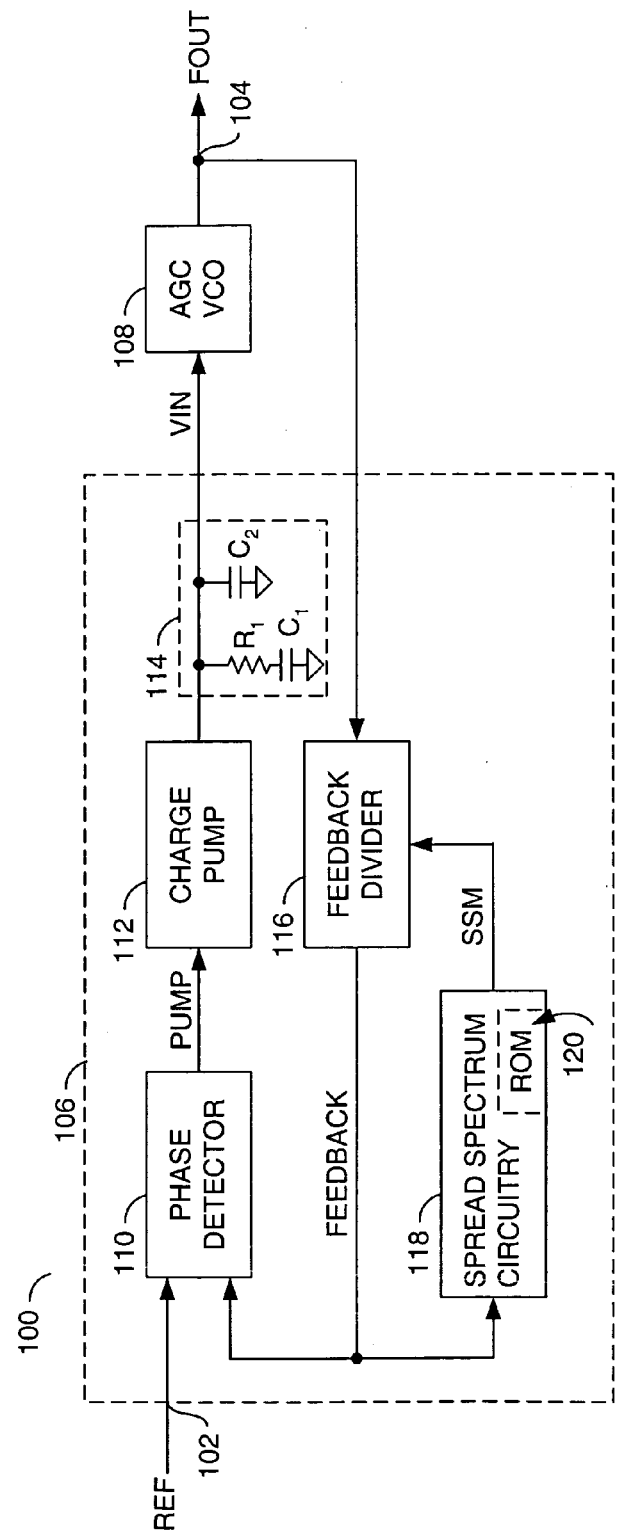
FIG. 4
FIG. 5

ADAPTIVE SPREAD SPECTRUM

CROSS REFERENCE TO RELATED APPLICATIONS

The present application may relate to application Ser. No. 09/618,706, filed Jul. 18, 2000, now U.S. Pat. No. 6,404,294, which is hereby incorporated by reference in its entirety.

FIELD OF THE INVENTION

The present invention relates to a method and/or architecture for generating a spread spectrum clock generally and, more particularly, to a method and/or architecture for generating an adaptive spread spectrum clock.

BACKGROUND OF THE INVENTION

Electronic devices must meet maximum electromagnetic interference (EMI) radiation limits as specified by the United States Federal Communications Commission (FCC) and other comparable regulatory agencies in other countries. New FCC requirements call for personal computer (PC) motherboards to be able to pass electromagnetic interface (EMI) tests "open box," so manufacturers will not be able to rely on the shielding provided by the case in meeting EMI requirements.

An EMI suppression-enabled clock integrated circuit (IC) can reduce the system radiated EMI. The reduction in radiated EMI can result in dramatic cost savings for the system. Conventional techniques for reducing EMI include ground planes, filtering components, shielding, and spread spectrum modulated system clocks.

In the spread spectrum technique, instead of concentrating all of a frequency reference's energy on a single frequency, the energy is spread out by modulating the frequency. The modulation results in the energy being spread over a frequency range, instead of being concentrated on one particular frequency. Since the FCC and other regulatory bodies are concerned with peak emissions, not average emissions, the reduction in peak energy due to spread spectrum modulation will help a product meet FCC requirements.

Referring to FIG. 1, a block diagram of a circuit 10 illustrating a conventional phase lock loop based spread spectrum clock generator is shown. The circuit 10 generates a signal OUT in response to a reference signal REF. The circuit 10 comprises a phase detector 12, a charge pump 14, a low pass filter 16, a linear voltage controlled oscillator (VCO) 18, a feedback divider 20 and a spread spectrum circuitry block 22. The phase detector 12 has a first input that receives a reference signal REF and a second input that receives a feedback signal FEEDBACK. An output of the phase detector 12 presents a pump signal PUMP to an input of the charge pump 14. The charge pump 14 generates a control signal VIN in response to the signal PUMP. The signal VIN is filtered by a low pass filter 16 and presented to an input of the linear VCO 18. The linear VCO 18 generates a signal OUT in response to the signal VIN. The signal OUT has a frequency that is linearly dependant upon a voltage level of the signal VIN. The signal OUT is presented to an input of the feedback divider 20. The feedback divider 20 generates the signal FEEDBACK in response the signal OUT and a control signal SSM. The signal FEEDBACK is presented to an input of the spread spectrum circuitry block 22. The spread spectrum circuitry block 22 generates the signal SSM in response to the signal FEEDBACK and a set of ROM codes 24. The frequency of the signal OUT is modulated in response to the signal SSM.

Referring to FIG. 2, a line graph illustrating the frequency of the signal OUT versus the voltage level of the signal VIN is shown. The frequency of the signal OUT is linearly related to the voltage level of the signal VIN. Changes in the frequency of the signal OUT are related to changes in the voltage level of the signal VIN by a constant value.

The set of ROM codes 24 of a conventional digital spread spectrum clock generator are optimized for a particular frequency. For good performance, a conventional spread spectrum clock generator requires a separate set of ROM codes for each frequency at which the spread spectrum clock generator will operate. In order to get the best EMI reduction, every applied frequency needs a unique set of ROM codes. A full range of applied frequency can vary from 50 MHz to 170 MHz. In order to cover the full range using conventional spread spectrum clock generating devices, at least 5 devices are required. Each of the devices is configured to operate over a 10 MHz portion of the full range. However, the best performance is at the optimized frequency of the ROM codes of each device. The performance of the devices at other than optimized frequencies will be compromised.

A set of spread spectrum ROM codes occupies a large portion of a spread spectrum device. Multiple sets of ROM codes requires large amounts of space. Without multiple sets of ROM codes, the effectiveness of spread spectrum modulation is compromised as frequency changes.

Referring to FIGS. 3a–3d, oscilloscope traces illustrating degradation of the spread spectrum modulation of the signal OUT at various frequencies. As the frequency of the signal OUT changes, modulation of the frequency of the signal OUT varies from an ideal profile (i.e., FIG. 3b). FIG. 3b illustrates the signal OUT having a mean frequency of 79 MHz. When the signal OUT has a mean frequency of 79 MHz, modulation of the signal FOUT follows an ideal profile for spread spectrum modulation. FIG. 3a illustrates changes in the modulation profile when the signal OUT has a mean frequency of 48 MHz. FIG. 3c illustrates the signal OUT having a mean frequency of 107 MHz. When the signal OUT has a mean frequency of 107 MHz, modulation of the signal OUT is similar to a triangle waveform. Referring to FIG. 3d, as the mean frequency of the signal OUT increases to 149 MHz, modulation of the signal OUT becomes sinusoidal.

Another conventional approach that uses a single set of ROM codes for multiple frequencies is to adjust the bandwidth of the spread spectrum clock generator using an external low pass filter. The components of the external filter must be changed to compensate for each change in frequency. However, the external low pass filter provides very limited improvement.

A spread spectrum clock generator that uses a single set of ROM codes, requires no adjustment, and could generate any frequency in a wide range of frequencies, would be desirable.

SUMMARY OF THE INVENTION

The present invention concerns an apparatus comprising a circuit that may be configured to generate a spread spectrum clock signal. The circuit may comprise a voltage controlled oscillator that may have an automatically controlled gain.

The objects, features and advantages of the present invention include providing a method and/or architecture for generating an adaptive spread spectrum clock that may (i) provide all frequency spreading in one device, (ii) spread spectrum modulate any frequency of a continuous range, (iii) require only one set of ROM codes and/or (iv) automatically adjust a gain of a voltage controlled oscillator (VCO) in response to frequency changes.

BRIEF DESCRIPTION OF THE DRAWINGS

These and other objects, features and advantages of the present invention will be apparent from the following detailed description and the appended claims and drawings in which:

FIG. 1 is a block diagram of a conventional spread spectrum PLL;

FIG. 2 is a line graph illustrating a transfer function of a linear voltage controlled oscillator of FIG. 1;

FIGS. 3a–3d are oscilloscope traces illustrating operation of the circuit 10 of FIG. 1;

FIG. 4 is a block diagram of a preferred embodiment of the present invention;

FIG. 5 is a more detailed block diagram of a preferred embodiment of the present invention;

DETAILED DESCRIPTION OF THE PREFERRED EMBODIMENTS

Figure 6:
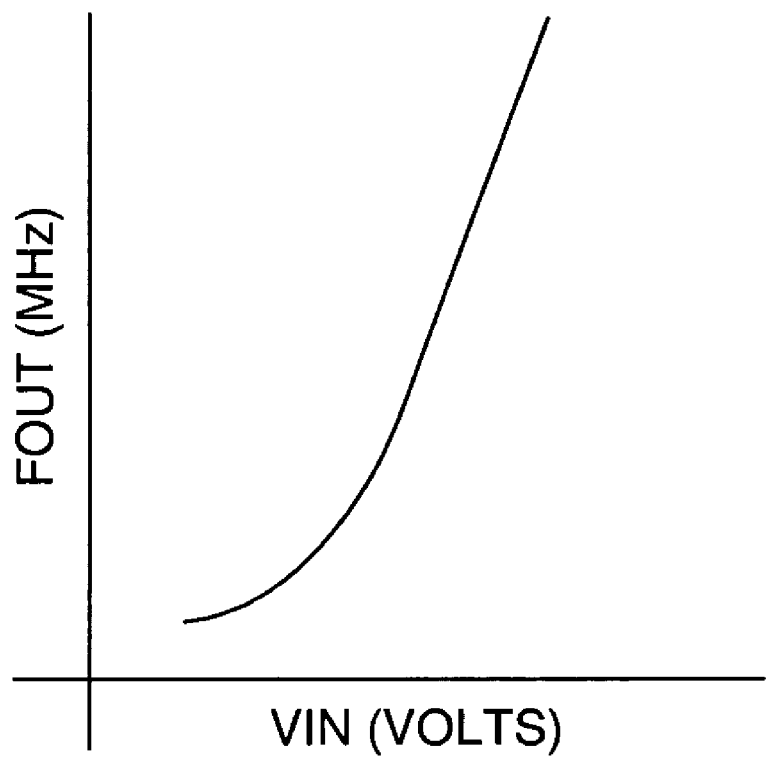
FIG. 6 is a line graph illustrating an example operation of a voltage controlled oscillator of FIGS. 4 and 5.

Referring to FIG. 4, a block diagram of a circuit 100 illustrating a preferred embodiment of the present invention is shown. The circuit 100 may be implemented, in one example, as a spread spectrum clock generating circuit for use in analog applications. The circuit 100 may have an input 102 that may receive a reference signal (e.g., REF) and an output 104 that may present a clock signal (e.g., FOUT). The signal FOUT may be, in one example, a spread spectrum clock signal that has a mean frequency determined by the frequency of the signal REF. The circuit 100 may provide optimized spread spectrum modulation over a wide range of frequencies of the signal REF.

The circuit 100 may comprise a circuit 106 and a circuit 108. The circuit 106 may be, in one example, a control circuit for controlling the frequency of the signal FOUT. The circuit 108 may be implemented, in one example, as a voltage controlled oscillator (VCO) having an automatically controlled gain (e.g., Kvco). In one example, the circuit 108 may have a non-linear gain. The circuit 106 may receive the signal REF and the signal FOUT. The circuit 106 may have an output that may present a signal (e.g., VIN) to an input of the circuit 108. The signal VIN may be a control signal. The signal VIN may have a voltage level that may vary in response to the signals REF and FOUT. The circuit 108 may be configured to generate the signal FOUT in response to the signal VIN. The gain of the circuit 108 may be adjusted according to a gain function (decribed in more detail in connection with FIGS. 6 and 7 below) in response to changes in frequency of an input signal (e.g., the signal REF).

Referring to FIG. 5, a more detailed block diagram of the circuit 100 is shown. The circuit 106 may comprise, in one example, a phase detector 110, a charge pump circuit 112, a low pass filter 114, a feedback divider 116 and a spread spectrum circuitry block 118. The signal REF may be presented to a first input of the phase detector 110. A feedback signal (e.g., FEEDBACK) may be presented to a second input of the phase detector 110. The phase detector 110 may have an output that may present a signal (e.g., PUMP) to an input of the charge pump 112. The charge pump 112 may have an output that may present a signal to an input of the low pass filter 114. The low pass filter 114 may have an output that may present the signal VIN. The circuit 108 may be configured to generate the signal FOUT in response to the signal VIN.

The signal FOUT may be presented to a first input of the feedback divider 116. A control signal (e.g., SSM) may be presented to a second input of the feedback divider 116. The feedback divider may have an output that may present the signal FEEDBACK in response to the signals FOUT and SSM. The signal FEEDBACK may be presented to an input of the spread spectrum circuitry block 118. The spread spectrum circuitry block 118 may comprise a set of spread spectrum ROM codes 120. The set of ROM codes may have been optimized for a particular mean frequency of the signal FOUT according to predetermined criteria. The spread spectrum circuitry block 118 may be configured to generate the signal SSM in response to the signal FEEDBACK and the set of ROM codes 120.

Referring to FIG. 6, a line graph illustrating an example relationship between the frequency of the signal FOUT and the voltage level of the signal VIN for the circuit 108 is shown. The gain Kvco of the circuit 108 may provide a non-linear relationship between the frequency of the signal FOUT and the voltage level of the signal VIN. In one example, the non-linear relationship may be represented as a parabolic function. However, the gain Kvco may be implemented accordingly with other second order or higher polynomial functions to meet the design criteria of a particular application. The gain Kvco may be, in one example, a function of the frequency of the signal FOUT (e.g., Kvco(f)). The function Kvco(f) may be determined, in one example, using a computer program or other suitable means for simulating behavior of the circuit 100 at various frequencies and various gains.

Figure 7:
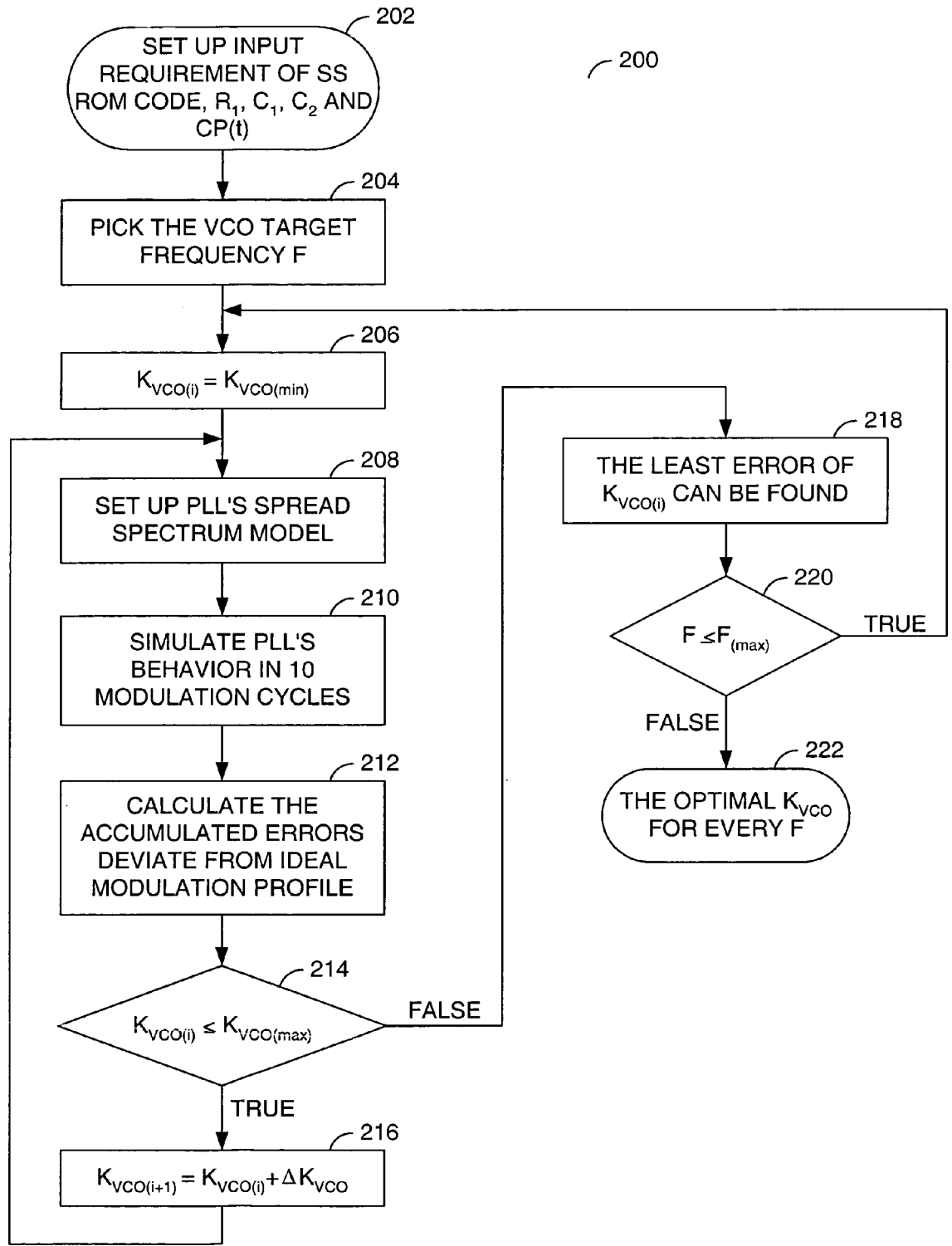
FIG. 7 is a flow chart illustrating a process for determining a gain curve in accordance with the present invention.
Figure 8A:
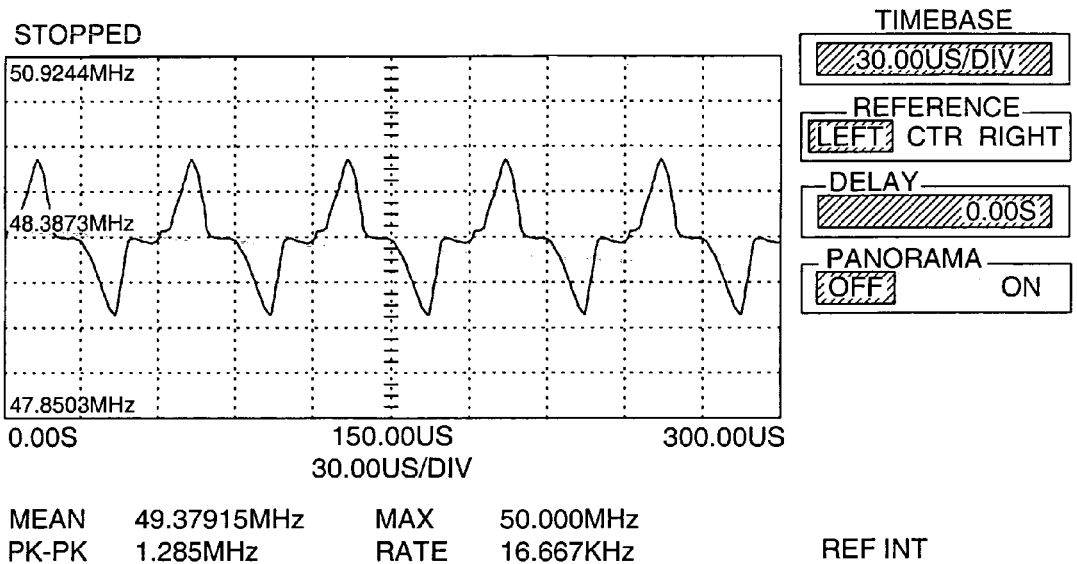
FIGS. 8a–8d are graphs illustrating an example operation of a preferred embodiment of the present invention.
Figure 8B:
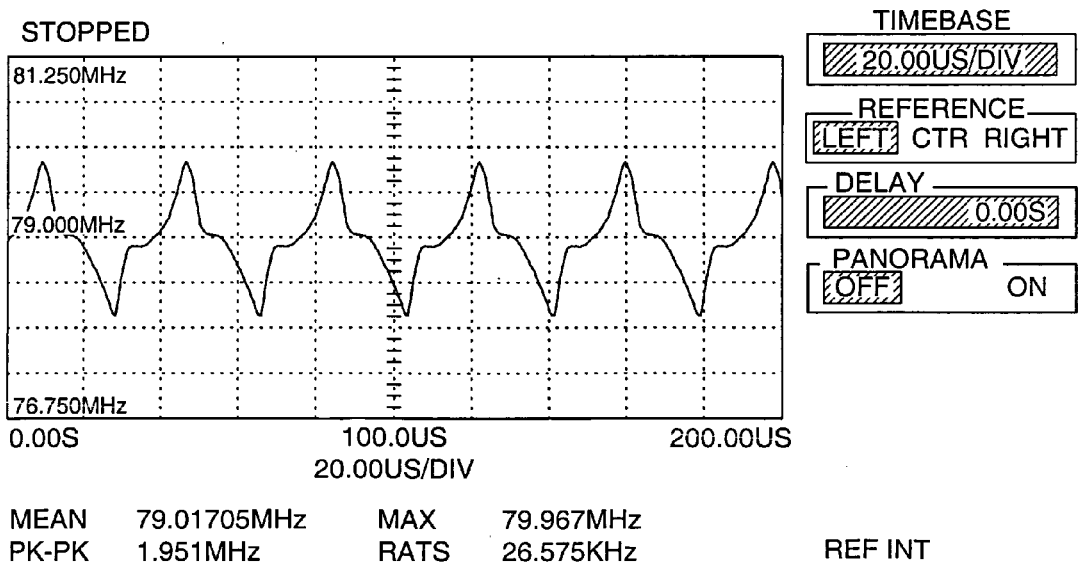
Figure 8C:
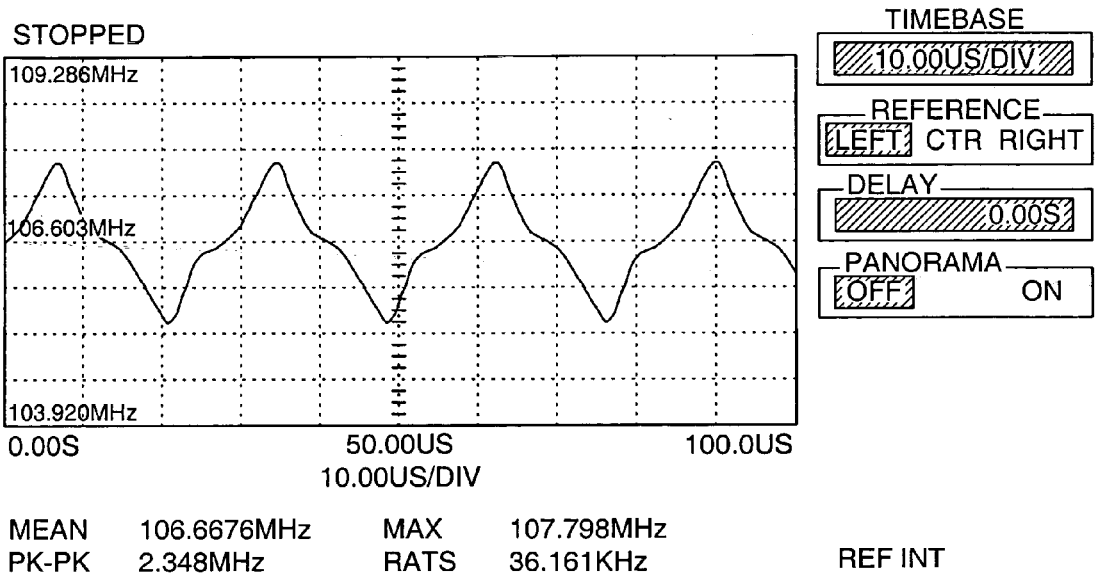
Figure 8D:
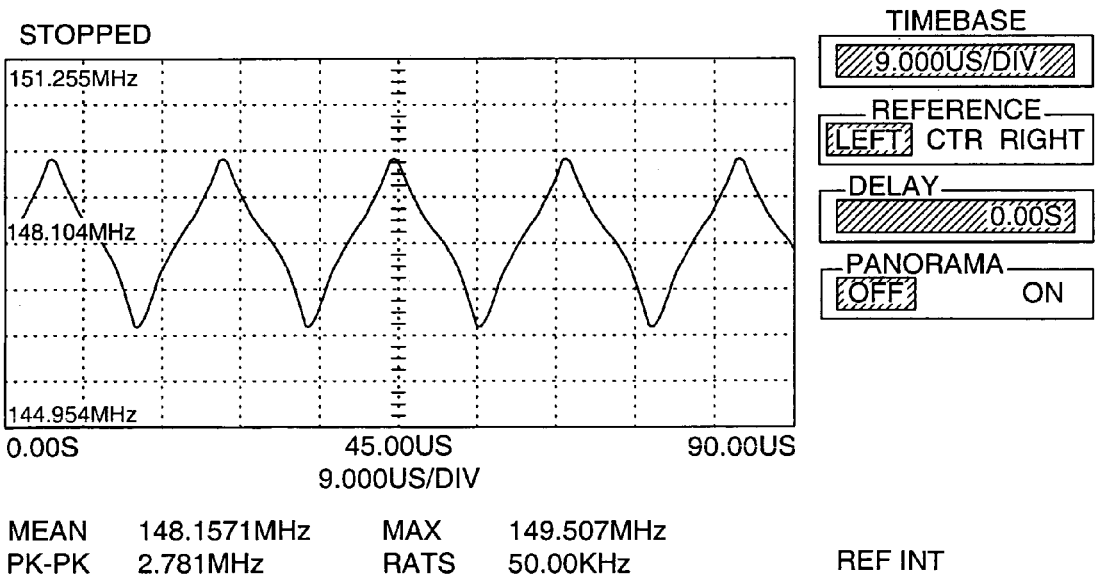

Referring to FIG. 7, a flow chart illustrating a process for determining a gain function (curve) of the circuit 108 in accordance with the present invention is shown. The process of determining the gain function of the circuit 108 may have an initial step of determining input requirements for the set of spread spectrum ROM codes of the spread spectrum circuitry 118 and resistance and capacitance values of components in the low pass filter 116 (e.g., R1, C1, C2 and CP(T), block 202). When the initial conditions have been determined, the next step may be to select an operating frequency for the circuit 108 (e.g., block 204). An iterative process may be used, in one example, to determine a best value for the gain of the circuit 108 for the selected operating frequency (e.g., Kvco(f)).

A first step of the iterative process may be to set the gain of the simulated circuit 108 (e.g., Kvco(i)) to a minimum value (e.g., Kvco(min), block 206). Next, a model of the spread spectrum performance of a phase lock loop (PLL) implemented with the circuit 108 may be set up (e.g., block 208). Behavior of the PLL may be simulated for a number of modulation cycles. In one example, ten modulation cycles may be simulated (e.g., block 210). When the number of modulation cycles have been simulated, an accumulated error deviation from an ideal modulation profile may be calculated (e.g., block 212). After determining the accumulated error deviation, a check may be made to see whether a maximum gain (e.g., Kvco(max)) has been reached (e.g., block 214). If the maximum gain Kvco(max) has not been reached, then the gain parameter may be incremented by a predetermined delta gain (e.g., Kvco, block 216) and another iteration performed. The process may be repeated until the range of gains Kvco(min)–Kvco(max) may have been simulated, as indicated by the arrow to the block 208.

When the maximum gain Kvco(max) has been reached, the process may branch to a determination of a particular gain Kvco(i) that generally produced a least amount of error (e.g., block 218). After determining the gain Kvco(i) a check may be made to see whether a maximum frequency (e.g., f(max)) for the particular application may have been reached (e.g., block 220). If the maximum frequency f(max) has not been reached, a next frequency may be selected and the process may be repeated for the next frequency. If the maximum frequency f(max) has been reached, the process may branch to a termination stage (e.g., block 222). The termination stage may be entered, in one example, when a gain Kvco(i) has been determined for the frequencies in a predetermined range (e.g., 50 MHz–170 MHz).

The function performed by the flow diagram of FIG. 7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMS, EEPROMS, Flash memory, magnetic or optical cards, or any type of media suitable for storing electronic instructions.

Referring to FIGS. 8a–8d, oscilloscope traces illustrating the signal FOUT in accordance with the present invention. The signal FOUT is generally illustrated having frequencies similar to the signal OUT as illustrated in the FIGS. 3a–3d. A comparison of the FIGS. 3a–3d to the FIGS. 8a–8d generally shows that the present invention may provide improved spread spectrum modulation over a wider frequency range than a conventional spread spectrum clock generator.

The present invention may provide a digital spread spectrum apparatus and/or method with analog spread spectrum capabilities. The present invention may comprise, in one example, a voltage controlled oscillator having an automatically controlled gain and a set of ROM codes. The set of ROM codes may be optimized for a particular frequency. When a selected VCO frequency is higher than the optimized frequency, the gain of the VCO may be adjusted higher. When the selected VCO frequency is lower than the optimized frequency, the gain of the VCO may be adjusted lower. A computer program may be used to model a spread spectrum clock generator in accordance with the present invention. The computer program may determined a gain curve that may describe the gain of the VCO as a function of output frequency. The VCO gain curve may be used to implement an adaptive spread spectrum clock generator that automatically adjust PLL behavior when frequency is changed.

An alternative embodiment may provide adaptive spread spectrum capability by adjustment of a charge pump current. However, charge pump current may be more sensitive and/or more difficult to control than the gain of a VCO.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
a circuit configured to generate a spread spectrum clock signal in response to an input signal, wherein (i) said circuit comprises a voltage controlled oscillator having an automatically controlled nonlinear gain, (ii) said nonlinear gain varies according to a function curve in response to changes in frequency of said input signal and (iii) said function curve for said nonlinear gain is determined according to predetermined criteria.

2. The apparatus according to claim 1, wherein said function curve is a parabolic curve.

3. The apparatus according to claim 1, wherein said function curve is a second degree or higher polynomial.

4. The apparatus according to claim 1, wherein a computer program is used to generate said function curve for said gain.

5. The apparatus according to claim 1, wherein said spread spectrum clock signal is generated in response to a reference signal having any frequency from 50 to 170 MHZ.

6. The apparatus according to claim 1, wherein said circuit further comprises a single set of ROM codes configured to generate said spread spectrum clock signal having any frequency from 50 to 170 MHZ.

7. The apparatus according to claim 6, wherein said ROM codes determine a frequency modulation profile for said spread spectrum clock signal.

8. The apparatus according to claim 7, wherein said circuit further comprises a divider circuit.

9. The apparatus according to claim 8, wherein said ROM codes control said divider circuit.

10. An apparatus comprising:
a voltage controlled oscillator (VCO) configured to generate a spread spectrum clock signal in response to a control signal, wherein (i) said VCO has a nonlinear gain that is automatically controlled (ii) said nonlinear rain varies according to a rain function in response to changes in frequency of a reference signal and (iii) said gain function is determined according to predetermined criteria; and
a control circuit configured to generate said control signal in response to (i) said reference signal, (ii) said spread spectrum clock signal, and (iii) a set of ROM codes.

11. A method for adapting a single spread spectrum ROM code to generate a spread spectrum clock signal over a wide continuous range of frequencies comprising the steps of:
(A) determining a nonlinear gain function for a voltage controlled oscillator (VCO) according to predetermined criteria;
(B) adjusting a gain of said VCO according to said gain function in response to changes in frequency of an input signal; and
(C) configuring said VCO to generate said spread spectrum clock signal.

12. A method for adapting a single spread spectrum ROM code to generate a spread spectrum clock signal over a wide continuous range of frequencies comprising the steps of:

(A) determining a nonlinear gain function for a voltage controlled oscillator (VCO) according to predetermined criteria;

(B) adjusting a gain of said VCO according to said gain function in response to changes in frequency of an input signal; and (C) configuring said VCO to generate said spread spectrum clock signal, wherein step A comprises the sub-steps of:

(A-1) selecting a target frequency for said VCO;

(A-2) setting a gain value for said VCO;

(A-3) simulating a spread spectrum phase lock loop comprising said VCO for a number of modulation cycles using said target frequency and said gain value; and (A-4) calculating an accumulated error deviation between a modulation profile resulting from simulating said spread spectrum phase lock loop and an ideal modulation profile.

13. The method according to claim 12, further comprising the sub-step of:

(A-5) repeating steps A-2 through A-4 for a range of gains.

14. The method according to claim 13, further comprising the sub-step of:

(A-6) repeating steps A-1 through A-5 for a range of frequencies.

15. A computer readable media comprising instructions for performing the sub-steps according to claim 12.

16. A computer readable media comprising instructions for performing the sub-steps according to claim 13.

17. A computer readable media comprising instructions for performing the sub-steps according to claim 14.

18. The method according to claim 12, further comprising the step of:

determining a gain value for said VCO that produces a least amount of said error deviation.

19. The method according to claim 14, further comprising the step of:

determining a gain function curve for said VCO that produces a least amount of said error deviation for said range of frequencies.

20. An apparatus comprising:

a circuit configured to generate a spread spectrum clock signal, wherein (i) said circuit comprises a voltage controlled oscillator having an automatically controlled nonlinear gain, (ii) said nonlinear gain varies in response to a frequency of said spread spectrum clock signal and (iii) a function curve for said nonlinear gain is configured to minimize an error deviation of said spread spectrum clock signal from an ideal modulation profile over a predetermined frequency range.

21. An apparatus comprising:

a voltage controlled oscillator (VCO) configured to generate a spread spectrum clock signal in response to a control signal, wherein (i) said VCO has a nonlinear gain that is automatically controlled and varied in response to a frequency of said spread spectrum clock signal and (ii) a function curve for said nonlinear gain is configured to minimize an error deviation of said spread spectrum clock signal from an ideal modulation profile over a predetermined frequency range; and a control circuit configured to generate said control signal in response to (i) a reference signal, (ii) said spread spectrum clock signal, and (iii) a set of ROM codes.

* * * * *